United States Patent
Jones et al.

(10) Patent No.: US 6,539,345 B1
(45) Date of Patent: Mar. 25, 2003

(54) SYMBOLIC SIMULATION USING INPUT SPACE DECOMPOSITION VIA BOOLEAN FUNCTIONAL REPRESENTATION IN PARAMETRIC FORM

(75) Inventors: Robert B. Jones, Hillsboro, OR (US); Carl-Johan H. Seger, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/289,412

(22) Filed: Apr. 9, 1999

(51) Int. Cl.⁷ .............................................. G06F 17/50
(52) U.S. Cl. ................. 703/15; 703/2; 703/22; 716/4
(58) Field of Search ........................... 703/1, 2, 13–22; 716/1–6

(56) References Cited

U.S. PATENT DOCUMENTS 5,649,165 A * 7/1997 Jain et al. ..................... 716/5
6,026,222 A * 2/2000 Gupta et al. ................... 716/5

OTHER PUBLICATIONS

Jain et al, "Some Techniques for Efficient Symbolic Simulation–based Verification", IEEE 1992 International Conference on Computer Design: VLSI in Computers and Processors, pp. 598–602 (Oct. 1992).*
Pandey et al, "Formal Verfication of Memory Arrays Using Symbolic Trajectory Evaluation", IEEE Proceedings of the International Workshop on Memory Technology, Design and Testing, pp. 42–49 (Aug. 1997).*
"Efficient Symbolic Simulation–Based Verification Using the Parametric Form of Boolean Expressions," Prabhat Jain et al., IEEE Transactions on Computer–Aided Design of Integrated Circuits and Systems, vol. 13, No. 8, Aug. 1994, pp. 1005–1015.

* cited by examiner

*Primary Examiner*—Samuel Broda
(74) *Attorney, Agent, or Firm*—Blakely, Sokoloff, Taylor & Zafman LLP

(57) ABSTRACT

The present invention is a method and apparatus to verify a design which has an input space and a predicate. The input space is decomposed into a plurality of decompositions. The input space includes a plurality of node variables. The plurality of decompositions includes parametric variables. The decompositions are parameterized into vectors of parametric functions to satisfy the predicate.

23 Claims, 9 Drawing Sheets

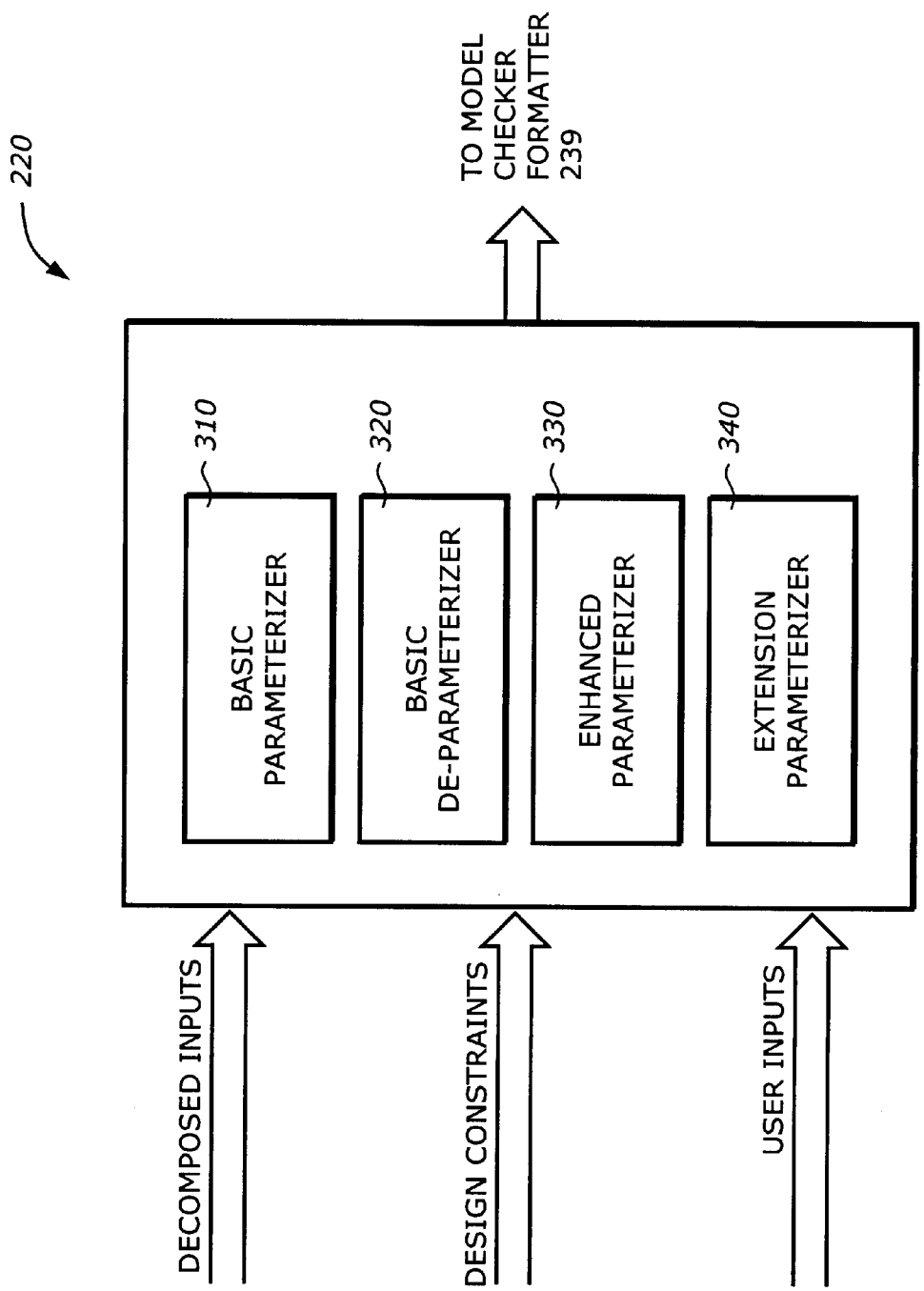

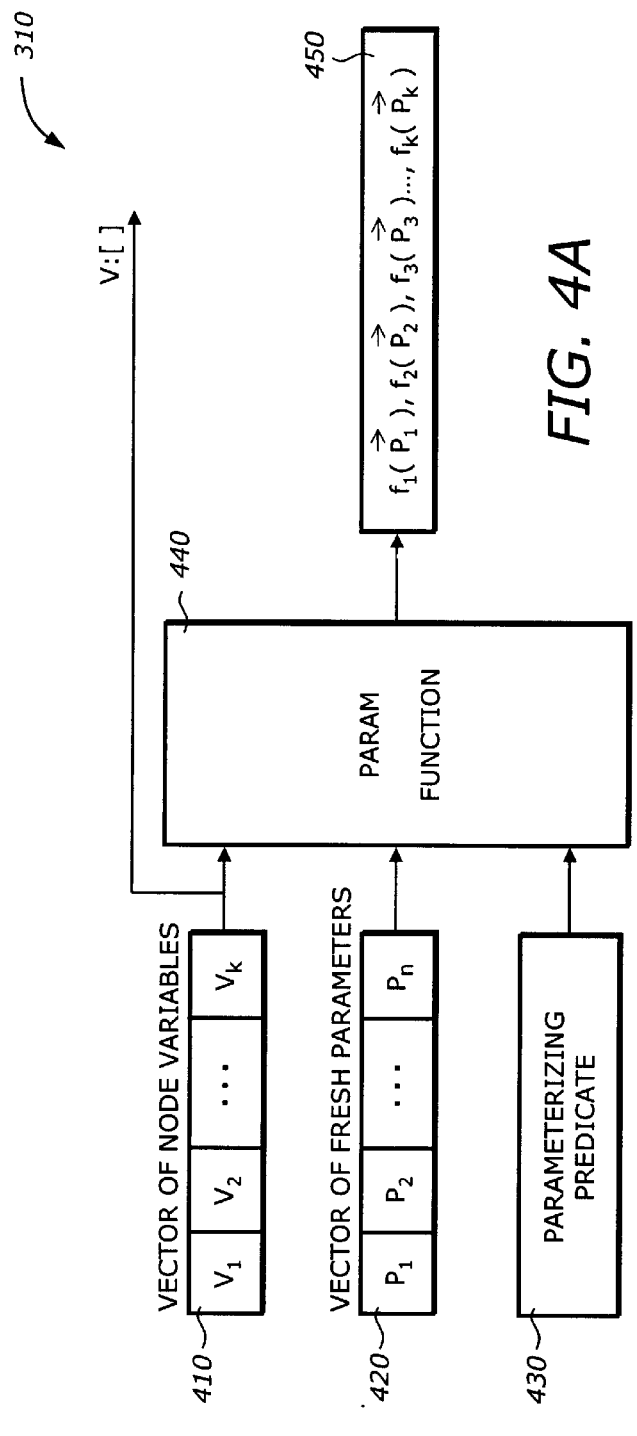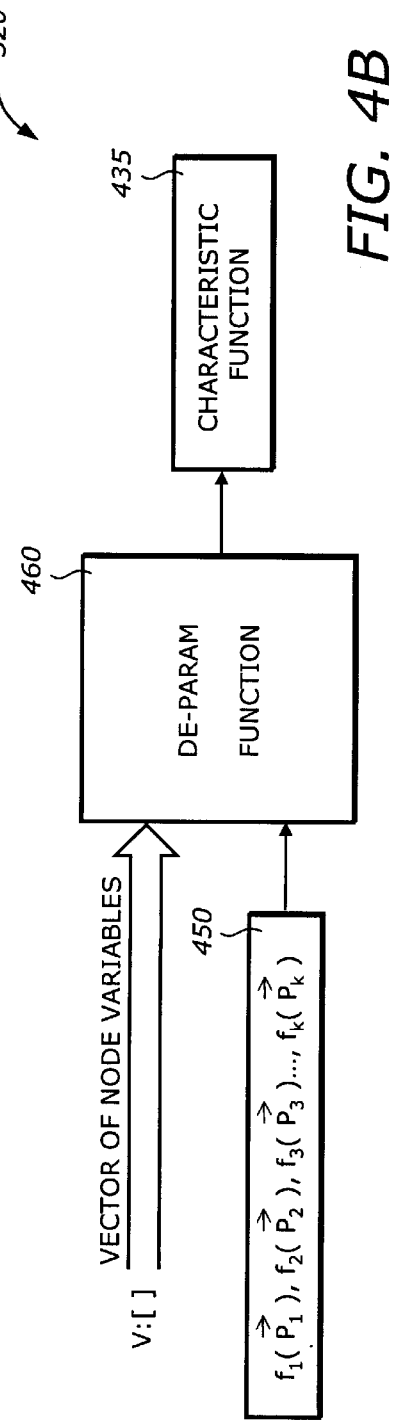
FIG. 4A
FIG. 4B

SYMBOLIC SIMULATION USING INPUT SPACE DECOMPOSITION VIA BOOLEAN FUNCTIONAL REPRESENTATION IN PARAMETRIC FORM

BACKGROUND

1. Field of the Invention

This invention relates to computer aided design (CAD). In particular, the invention relates to hardware functional verification.

2. Description of Related Art

As technology in computer aided design becomes mature, design verification has become more and more important to ensure design correctness of circuits. In formal design verification, checking logic functionality is a major step.

Approaches to logic checking include functional methods based on Boolean representations, such as Binary Decisions Diagrams (BDDs), and structural methods. Using a symbolic representation of Boolean functions, a generalized form of a problem can be expressed. Solving the generalized form leads to solutions of many specific problem instances. For example, the BDDs provide an efficient method to represent Boolean functions. BDDs are a canonical form, i.e., every Boolean function is represented by only one BDD. In certain approaches, logic checking with BDDs can be reduced to comparing two BDDs, a simple check for equality.

However, traditional approaches using Boolean expressions suffer a major drawback in that the design complexity (in terms of number of hardware elements) can lead to an exponential growth in the size of the BDDs. In traditional symbolic simulation approaches, distinct Boolean variables are applied at each circuit input. The circuit is then simulated until the symbolic output expressions are produced. These expressions are then restricted according to the input constraint(s) expressed by some Boolean predicate. For example, the results of symbolically simulating a floating-point adder with arbitrary inputs could be restricted by the desired constraints on the input nodes (e.g., to prevent illegal inputs, output overflow, or denormalization). As the circuit complexity grows, as is often the case with current designs, traditional approaches become impractical. The design complexity requires that the circuit be simultaneously simulated for all possible inputs with fully calculated outputs.

Jain and Gopalakrishnan (in "Efficient symbolic simulation-based verification using the parametric form of Boolean expression", IEEE Transactions on Computer-Aided Design of Integrated Circuits and Systems, Vol. 13, No. 8, August 1994, pp. 1005–1015) discusses the use of symbolic simulation and the parametric form. However, their technique does not work for an arbitrary predicate and does not apply parameterization in performing input space decomposition. Their technique applies only to designs that can be described recursively, and requires that the predicate be transformed to disjunctive normal form, which is impractical or impossible for the complex predicates encountered in industrial circuits.

Therefore, there is a need for a technology to provide a simple, flexible, and efficient method to decompose the input space and enhance the capacity of the verification.

SUMMARY

The present invention is a method and apparatus to verify a design which has an input space and a predicate. The input space is decomposed into a plurality of decompositions. The input space includes a plurality of node variables. The plurality of decompositions includes parametric variables. The decompositions are parameterized into vectors of parametric functions to satisfy the predicate.

BRIEF DESCRIPTION OF THE DRAWINGS

The features and advantages of the present invention will become apparent from the following detailed description of the present invention in which:

FIG. 3 is a diagram illustrating a symbolic parameterization module according to one embodiment of the invention.

FIG. 4A is a diagram illustrating a basic parameterizer according to one embodiment of the invention.

FIG. 4B is a diagram illustrating a basic de-parameterizer according to one embodiment of the invention.

DESCRIPTION

Figure 1A:
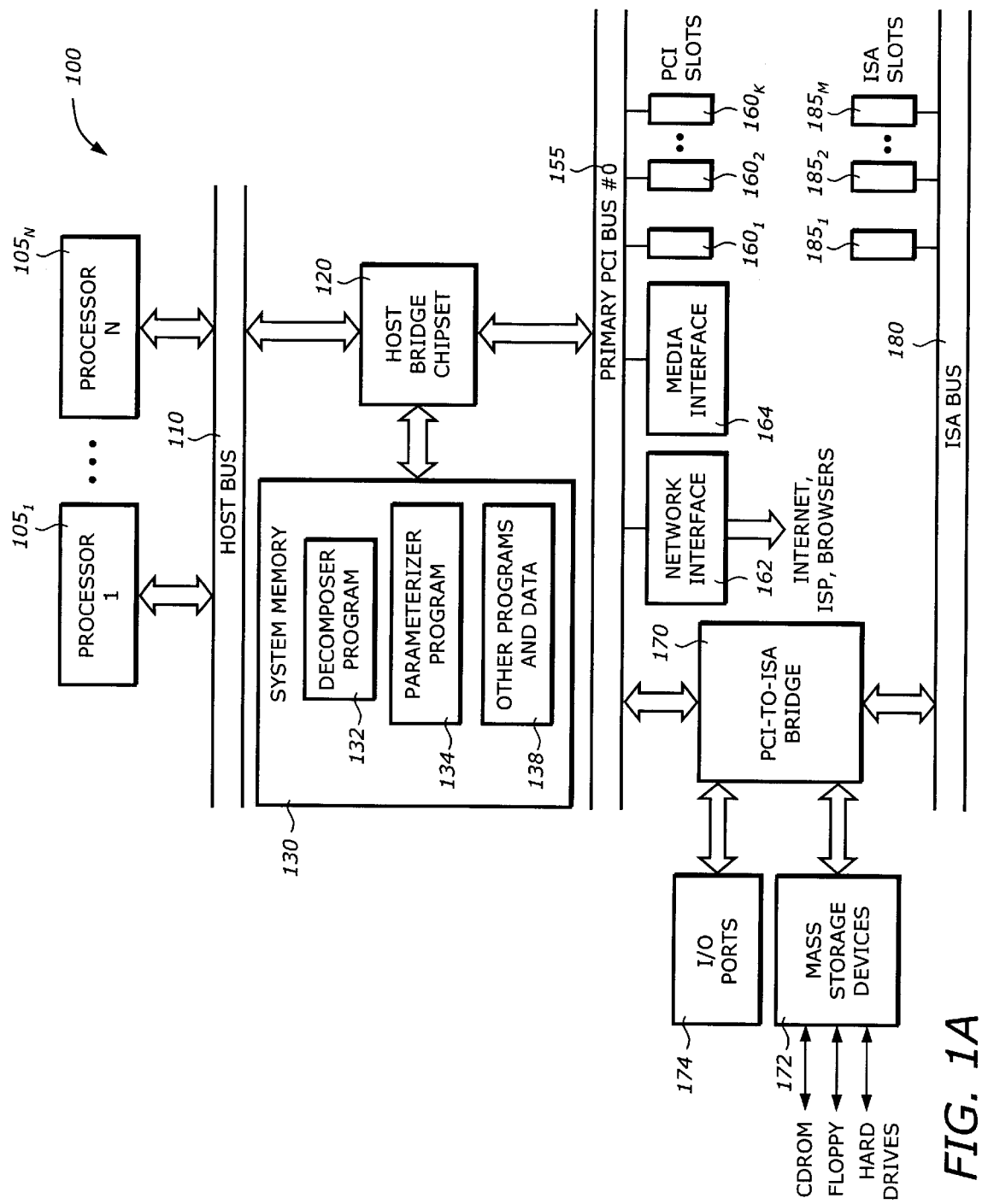
FIG. 1A is a diagram illustrating a computer system in which one embodiment of the invention can be practiced.

The present invention is a method and apparatus for parameterizing Boolean expressions for formal verification. The technique decomposes the input space and represents predicate over the vector of input node variables in parametric form. The technique enhances the capacity of formal verification.

In the following description, for purposes of explanation, numerous details are set forth in order to provide a thorough understanding of the present invention. However, it will be apparent to one skilled in the art that these specific details are not required in order to practice the present invention. In other instances, well-known electrical structures and circuits are shown in block diagram form in order not to obscure the present invention.

A parametric form of a Boolean predicate P is an alternative way of representing P in which the variables of P are replaced by a vector of new expressions over a fresh set of parametric variables. A Boolean expression representing constraints on circuit nodes (usually inputs and/or internal state) is converted into the parametric form and reflected into a vector of parametric expression. For example, one parametric representation for the predicate (i0+i1) over nodes i0 and i1 is (p0, p1+!p0). This vector is applied as the initial values on the corresponding circuit nodes for i0 and i1.

Many designs are too complex to be handled by direct verification. In the present invention, the input space is partitioned or decomposed to make the verification more manageable. Then, the individual parameterizations are used to verify each input space partition separately.

FIG. 1 is a diagram illustrating a computer system 100 in which one embodiment of the invention can be practiced.

The computer system 100 includes N processors $105_1$ through $105_N$, a host bus 110, a host bridge chipset 120, a system memory 130, a primary PCI bus #0 155, K PCI slots $160_1$ to $160_K$, a network interface 162, a media interface 164, a PCI-to-ISA bridge 170, mass storage devices 172, Input/Output (I/O) ports 174, an ISA bus 180, and ISA slots $185_1$ to $185_M$.

Each of the processors $105_1$ to $105_N$ represents a central processing unit of any type of architecture, such as complex instruction set computers (CISC), reduced instruction set computers (RISC), very long instruction word (VLIW), or hybrid architecture. The invention could be implemented in a multi-processor or single processor computer system.

The host bridge chipset 120 includes a number of interface circuits to allow the host processors $105_1$ to $105_N$ access to the system memory 130 and the primary PCI bus #0 155. The system memory 130 represents one or more mechanisms for storing information. For example, the system memory 130 may include non-volatile or volatile memories. Examples of these memories include flash memory, read only memory (ROM), or random access memory (RAM). The system memory 130 includes a decomposer program 132, a parameterizer program 134 and other programs and data 138. Of course, the system memory 130 preferably contains additional software (not shown), which is not necessary to understanding the invention.

When implemented in software, the elements of the decomposer 132 and the parameterizer 134 are essentially the code segments to decompose the input space and to parameterize the decompositions, respectively. The program or code segments can be stored in a processor readable medium. The "processor readable medium" may include any medium that can store or transfer information. Examples of the processor readable medium include an electronic circuit, a semiconductor memory device, a read-only memory (ROM), a flash memory, an erasable ROM (EROM), a floppy diskette, a compact disk (CD) ROM, an optical disk, a hard disk, a transmission medium, a fiber optic medium, a radio frequency (RF) link, etc. The PCI slots $160_1$ to $160_K$ provide interfaces to PCI devices. Examples of PCI devices include the network interface 162 and the media interface 164. The network interface 162 connects to communication channel such as the Internet. The Internet provides access to on-line service providers, Web browsers, and other network channels. The media interface 164 provides access to audio and video devices.

The PCI-to-ISA bridge provides access to the ISA bus 180, mass storage devices 172, and I/O ports 174. The mass storage devices 172 include CD ROM, floppy diskettes, and hard drives. The ISA bus 180 has a number of ISA slots $185_1$ to 185M to interface to ISA devices. Examples of ISA devices include data entry devices (e.g., keyboard, mouse), printers, etc.

Figure 1B:
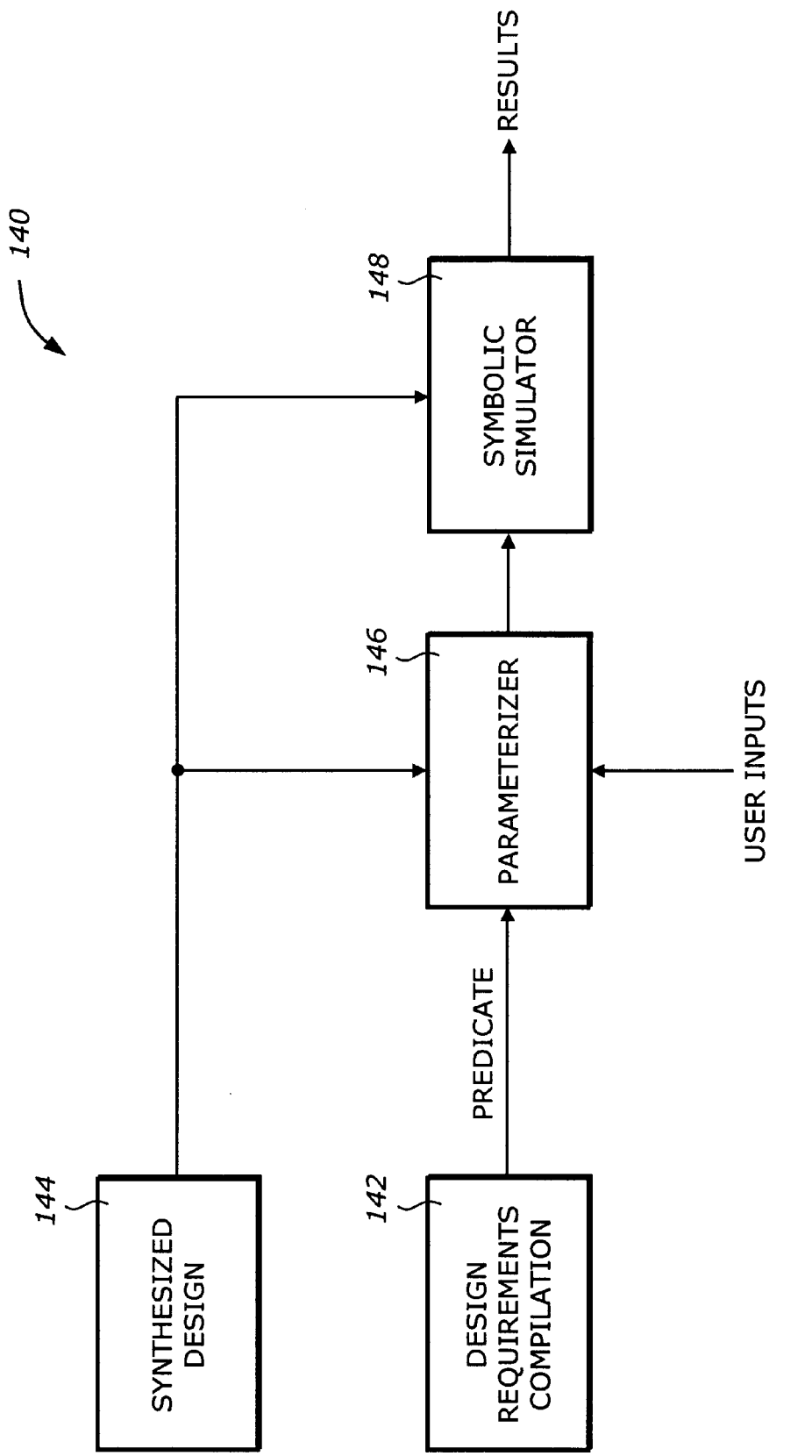
FIG. 1B is a diagram illustrating a verification process in which one embodiment of the invention can be practiced.

FIG. 1B is a diagram illustrating a verification process in which one embodiment of the invention can be practiced. The verification process 140 includes a design requirements compilation space 142, a synthesized design 144, a parameterizer 146, and a symbolic simulator 148.

The design requirements compilation 142 compiles the requirements and/or environmental assumptions for the design. The requirements compilation 142 includes any method to generate the design specifications such as equations, design files in hardware description languages, etc. The synthesized design 144 includes the generation of the design, circuits, subsystems, etc. The synthesized design 144 is the design to be verified and/or simulated. The synthesized design 144 includes description of elements, equations relating the elements, input specifications and output equations.

The parameterizer 146 receives the design constraints in forms of a predicate over the input and/or internal variables of the design. The parameterizer 146 then computes a vector of functions over some parametric variables that incorporate the constraint expressed by the predicate. The symbolic simulator 148 takes this vector of parametric functions and simulates it on the design. In one embodiment, a verification tool, referred to as FORTE, uses a generalization of symbolic simulation called symbolic trajectory evaluation (STE). The FORTE tool uses the parameterizer 146 as part of the verification library.

Figure 2:
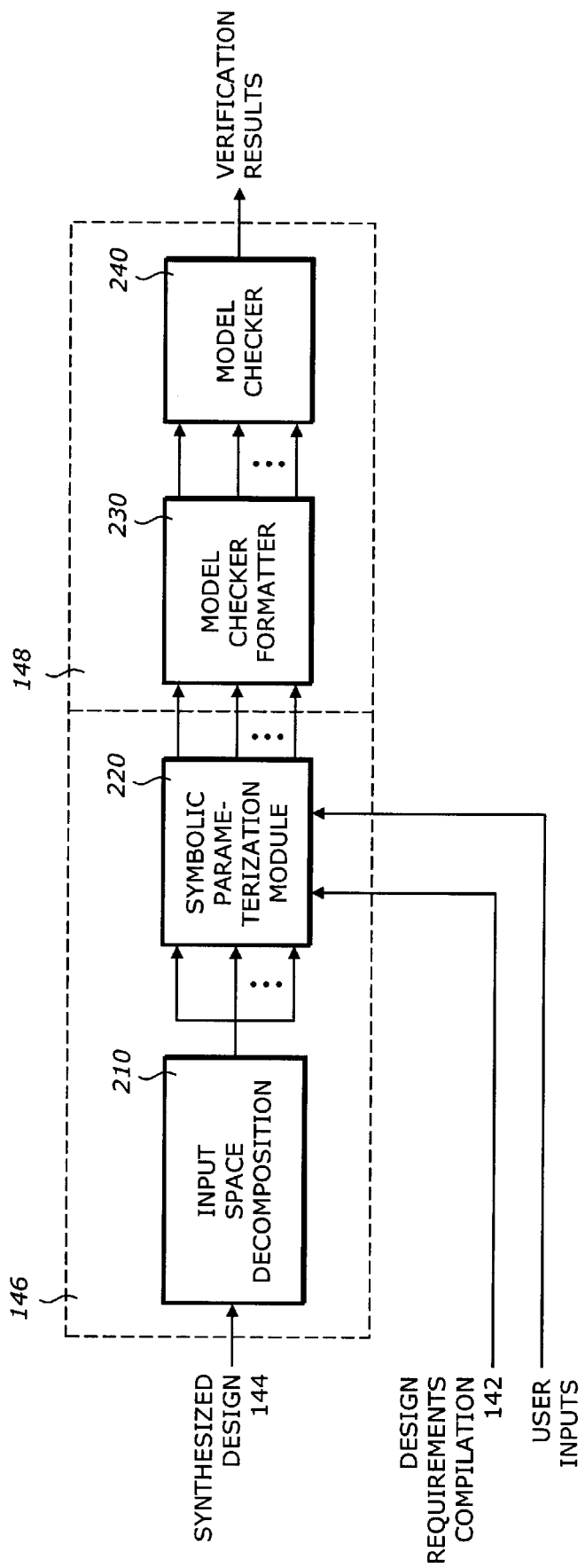
FIG. 2 is a diagram illustrating a parameterized verification according to one embodiment of the invention.

FIG. 2 is a diagram illustrating a parameterizer 146 and the symbolic simulator 148 shown in FIG. 1 according to one embodiment of the invention. The parameterizer 146 includes an input space decomposition 210 and a symbolic parameterization module 220. The symbolic simulator 148 includes a model checker formatter 230 and a model checker 240.

The input space decomposition 210 decomposes the input space of the synthesized design 144 into individual predicates over the node variables. The symbolic parameterization module 220 parameterizes the predicates and generates individual parameterized vectors. The model checker formatter 230 formats the parameterized vectors to be compatible with the model checker 240. The model checker 240 performs the logic checking step of the design using the parameterized expressions and generates the verification results.

The input space decomposition 210 and the symbolic parameterization module 220 may be implemented by hardware or software. In one embodiment, the input space decomposition 210 and the symbolic parameterization module 220 are implemented by software, and correspond to the decomposer program 132 and the parameterizer program 134, respectively, as shown in FIG. 1A. They work together to represent the partitioning of the input space in parametric form. An example is now given to illustrate this concept.

Suppose C is a circuit with input nodes {i0, i1} and a requirement that the values on the input nodes satisfy the expression (i0 & i1). The parameterizer 130 will compute the input vector {T, T}, where T refers to the logic true, and the circuit C is symbolically simulated to derive the outputs.

Suppose instead it is desired to verify the behavior of C when the input nodes satisfy the expression (i0+i1). In this case the parameterizer 130 will compute the input vector {p0, p1+!p0} and the circuit C is symbolically simulated to derive the outputs for the input vector.

In the example where the input nodes (i0, i1) satisfy the predicate (i0+i1), one possible parametric representation is i0=p0, i1=p1+!p0. Using this parametric representation, any possible assignment to p0, p1 will satisfy the predicate (i0+i1) as shown below:

| p0 | p1 | i0 | i1 | i0 + i1 |
|----|----|----|----|---------|
| F  | F  | F  | T  | T       |
| F  | T  | F  | T  | T       |
| T  | F  | T  | F  | T       |
| T  | T  | T  | T  | T       |

Furthermore, every input vector satisfying i1+i0 will be generated for some assignment to p0 and p1.

FIG. 3 is a diagram illustrating a symbolic parameterization module 220 shown in FIG. 2 according to one embodiment of the invention. The symbolic parameterization module 220 includes a basic parameterizer 310, a basic de-parameterizer 320, an enhanced parameterizer 330, and an extension parameterizer 340.

The basic parameterizer 310 receives the predicates formed from the input space decomposition 210 (FIG. 2), the design constraints from the requirements compilation 110, and the user inputs. The basic parameterizer 310 parameterizes the predicates and generates the parameterized vectors for logic checking. The basic de-parameterizer 320 receives a parameterized vector such as one generated from the basic parameterizer 310 and produces a characteristic function for the predicate over the input vectors. The enhanced parameterizer 330 enhances the parameterization by combining multiple input vectors for efficient verification. The extension parameterizer 340 includes the processing of free variables, i.e., variables that are not being parameterized.

FIG. 4A is a diagram illustrating a basic parameterizer 310 shown in FIG. 3 according to one embodiment of the invention. The basic parameterizer 310 includes a vector of node variables 410, a vector of fresh parameters 420, a parameterizing predicate 430, a parameterizing function (called param) 440, and a parameterized output vector 450.

The vector of node variables 410 depends on the synthesized design 120. The vector of fresh parameters 420 is derived from the user inputs. The parameterizing predicate 430 is derived from the design constraints and the input decomposition 210. The param function 440 receives the vector of node variables 410, the vector of fresh parameters 420, and the parameterizing predicate 430 to generate the parameterized output vector 450. The parameterized output vector 450 represents, in the parametric form, the parametric predicate as Boolean expressions.

In one embodiment, the param function 440 is a software function that takes the vector of node variables 410, the vector of fresh parameters 420 as the arguments and generates the parameterized output vector 450 using the parameterizing predicate 430. Appropriately written, the param function could safely re-use the same variable names for the parametric variables. However, using different variable names is desirable because: (1) the node variables in the vector of node variables 410 are logically distinct from the parameterization variables in the vector of fresh parameters 420, (2) interpreting the run-time information and counter-examples is less susceptible to error.

As an example, the code for the previous example is as follows:

load "symbsim.fl";
    // load symbolic simulation library which includes parametric functions
let i0=variable "i0";
let i1=variable "i1";
let p0=variable "p0";
let p1=variable "p1";
let param_fcns=parametric [i0, i1] [p0, p1] (i1 OR i0);
param_fcns;
→[p0, p1+!p0]

The param function can be described in the following pseudocode:

```
1: param (bdd var_vec[ ], bdd pvar_vec[ ], int index, bdd cond)
2: {
3:     bdd bit, low, high;
4:     bdd lres[index-1], hres[index-1], res[index];
5:
6:     if (cond = F)
7:         fatal_error ("predicate not satisfiable");
8:     if (exists_in_cache(var_vec, pvar_vec, index, cond))
9:         return (cached_result (var_vec, pvar_vec, index, cond));
10:    if (index = 0)
11:        return T;
12:    low := negative_cofactor(cond, var_vec[index]);
13:    high := positive cofactor(cond, var_vec[index]);
14:    if (low = F) {
15:        bit := T;
16:        res := param(var_vec, pvar_vec, index-1, high);
17:    } elself (high = F) {
18:        bit := F;
19:        res := param(var_vec, pvar_vec, index-1, low);
20:    } else {
21:        bit := pvar_vec[index];
22:        lres := param(var_vec, pvar_vec, index-1, low);
23:        hres := param(var_vec, pvar_vec, index-1, high);
24:        for i := 1 to index-1 {
25:            res[i] := BDD_if_then_else(bit, hres[i], lres[i]);
26:        }
27:    }
28:    res[index] := bit;
29:    insert_into_cache(var_vec, pvar_vec, index, cond, res);
30:    return res;
31: }
```

The process for computing the parametric representation is illustrated in the above pseudocode with four arguments.

1) var_vec is an array of BDD variables in the support of cond,
2) pvar_vec is an array of fresh BDD variables to be used in the parametric representation,
3) index is initially the length of var_vec, and
4) cond is the predicate (a BDD) to be parameterized.

If the predicate cond is not satisfiable, then it does not have a parametric representation, and so the process exits with a fatal error (lines 6,7). The process performs a recursive Shannon decomposition of the predicate by iterating through var_vec (lines 11, 16, 19, 22, 23), and taking the positive and negative cofactors of the refined predicate (lines 12–13). If the positive (negative) cofactor is empty, then the variable at this position cannot be T (F) under any interpretation, so a scalar F (T) is returned (lines 14–19).

If both cofactors are non-scalar (neither T nor F), then the appropriate parametric variable (from pvar_vec) is inserted in this position, and param is called recursively for both the positive and negative cofactors (lines 22–23). In each case, the final result vector res is constructed by combining the recursively generated results (lines 16, 19, 22–26).

As is typical of BDD applications, caching intermediate results (lines 8,9,29) is critical to the performance of the process: it often means the difference between exponential and linear run-times.

FIG. 4B is a diagram illustrating a basic de-parameterizer 320 shown in FIG. 3 according to one embodiment of the invention. The basic de-parameterizer 320 includes the parameterized output vector 450, a de-param function 460, and a characteristic function 435.

The basic de-parameterizer 320 essentially performs the reverse operation of the basic parameterizer 310 for purpose of debugging and/or testing of the symbolic parameterization module 220 (FIG. 2). The de-param function 460 receives the vector of node variables 410 and the parameterized output vector 450. The de-param function 460 then generates the characteristic function 435 which is the predicate over the node variables 410.

For the previous example, the de-param is a software function and is invoked as follows:

deparam [i0, i1] [p0, p1+!p0];

→i0+i1

The de-param (or unparam) function can be described in the following pseudo code.

```
1: unparam(bdd var_vec[], bdd pvar_vec[], int size, bdd param_vec[])
2: {
3:      bdd res, char_fun;
4:
5:      res := T;
6:      for j = 1 to size {
7:          res := res AND (var_vec[j] = param_vec[j]);
8:      }
9:      char_fun = quant_thereis(pvar_vec, res);
10:     return( char_fun );
11: }
```

The function unparam to de-parameterize takes 4 arguments:

1) a vector of input variables (var_vec)
2) a vector of parametric variables (pvar_vec)
3) a size of the vectors (size), and
4) the vector of parametric functions to be "unparameterized"

The function quant_thereis existentially quantifies out the parametric variables from res.

Figure 4C:
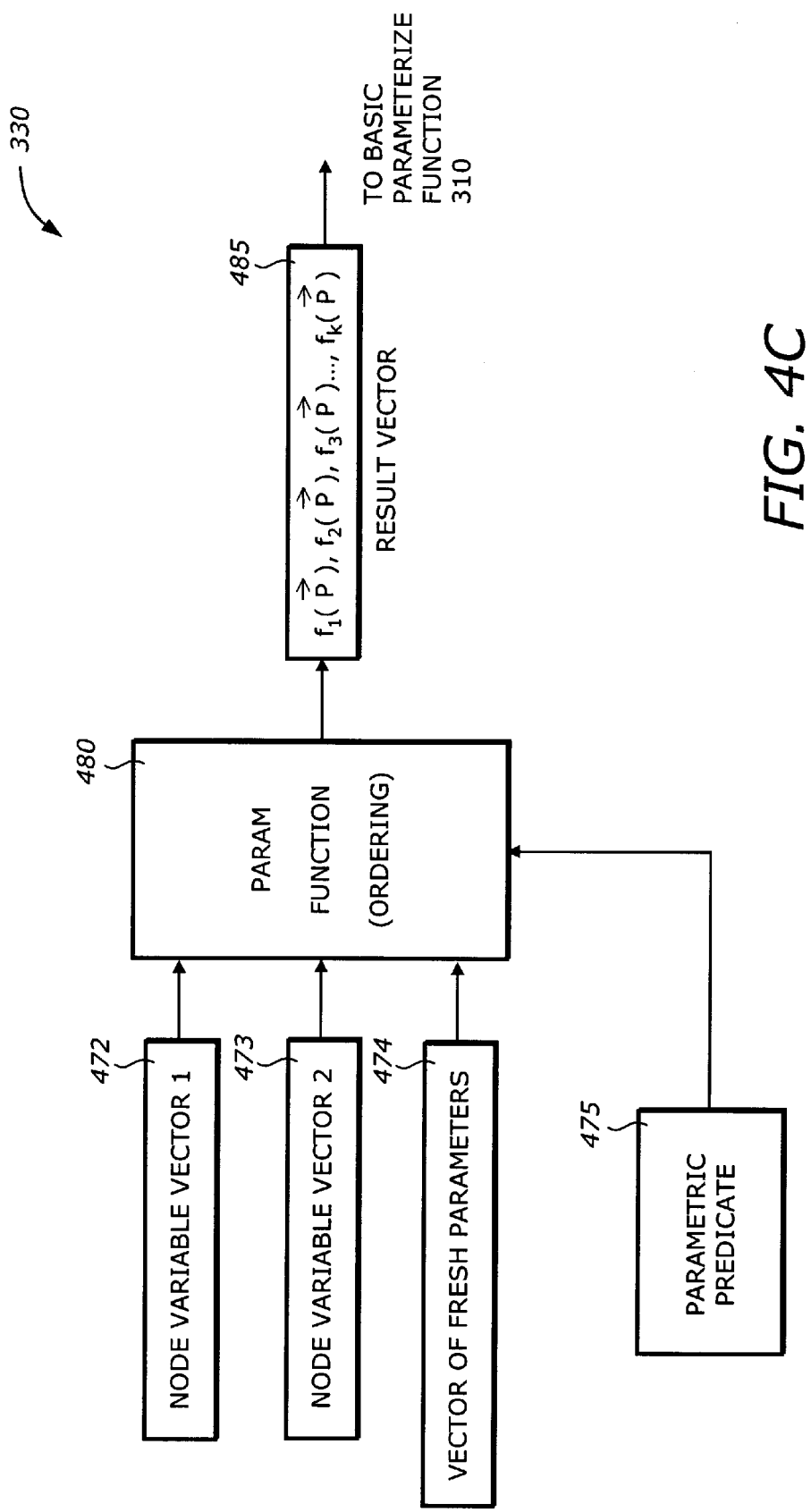
FIG. 4C is a diagram illustrating an enhanced parameterizer according to one embodiment of the invention.

FIG. 4C is a diagram illustrating an enhanced parameterizer 330 according to one embodiment of the invention. The enhanced parameterizer 330 includes a first vector of node variables 472, a second vector of node variables 473, a vector of fresh parameters 474, a predicate 475, a param function 480, and a vector of resulting parametric functions 485.

The first vector of node variables 472 is the input vector. The second vector of node variables 473 is an ordering input that provides an order in which the parameterization should be performed. This variable ordering input may be a global BDD variable ordering. The use of the global variable ordering has two advantages. First, the intermediate BDDs constructed during the function evaluation is as small as possible if the ordering is optimal. Second, the user may define a variable ordering which is appropriate for the predicate being parameterized.

The enhanced (or generalized) parameterizer 330 calls the basic parameterizer 310 (FIG. 4A) using the first vector of node variables 472. Then, it re-arranges the result of the basic parameterizer 310 to follow the order given by the second argument vector of node variables 473. The following example will illustrate this:

let a=variable_vector "a[15:0]";

let b=variable_vector "b[15:0]";

let p=variable_vector "p[31:0]";

enhanced_param (interleave (a,b)) (append (a,b)) p (a=b);

→[p[31], p[30], . . . , p[16], p[31], p[30], . . . , p[16]]

If the arguments (append (a,b)), p, and (a=b) are given to the basic parameterizer 310, the parameterization will not be completed because of an exponential run time. On the other hand, if the arguments (interleave (a,b)), p, and (a=b) are given to the basic parameterizer 310, the parameterization will be completed very quickly, but the result will be in the wrong order, requiring significant re-shuffling. The enhanced parameterizer 330 thus enhances the performance of the basic parameterizer 310.

Another useful function is to combine multiple parametric vectors. This function, referred to as param_V is as follows:

Param_V [a,b][Pa, Pb](a=b)

→[[Pa[15], Pa[14], . . . , Pa[0]], [Pa[15], {a[14], . . . , Pa[0]]]

Figure 4D:
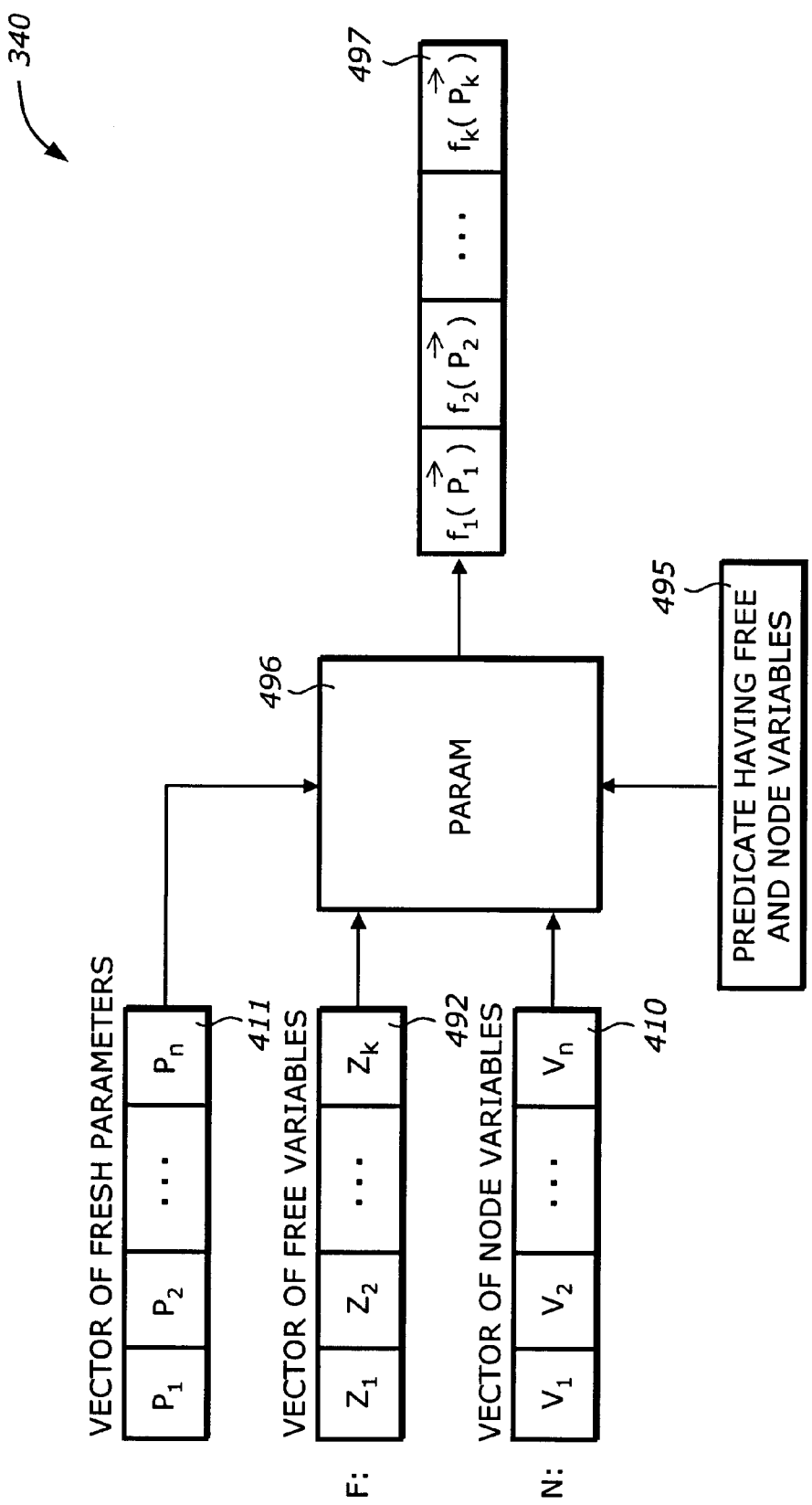
FIG. 4D is a diagram illustrating an extension parameterizer according to one embodiment of the invention.

FIG. 4D is a diagram illustrating according to one embodiment of the invention. The extension parameterizer 340 includes a vector of free variables 492, a vector of node variables 410, a vector of fresh parameters 411, a predicate 495, a param function 496, and a parameterized output vector 450.

The vector of node variables 410 is essentially the same as those shown in FIG. 4A. The vector of fresh parameters 411 contains variables that are parameterized or bound. The vector of free variables 492 contains variables that are not being parameterized or free. The parameterized output vector 497 contains all parametric functions for each of the node variables and the free variables. The predicate 495 includes partitioning the support for a predicate P into two sets F (free) and N (nodes). The param function 496 can parameterize any predicate that satisfies:

∀F. ∃N. P(F,N)

This ensures that no matter what assignment is chosen for F, there is a corresponding assignment(s) for N that satisfies P, and the parametric functions will be a function of the variables in F. Note that there is still a satisfiability requirement on P even if there are no free variables.

For example, suppose it is desired to parameterize i0, i1 for the predicate (z+i0+i1). The variable z is a free variable because it is not being parameterized. The variables {i0, i1} are bound variables. One possible parameterization for (i0, i1) is:

i0=p0 i1=p1+(!p0 !z0)

The pseudocode for param 496 is:

param [i0, i1][po, p1] (z OR i0 OR i1);

→[p0, p1+!p0 & !z]

In this case, no matter what value that z takes, there are assignments for p0, p1 which satisfy (z+i0+i1).

Now, suppose instead it is desired to parameterize i0, i1 for the function z & (i0+i1). If z is assigned false (F), then there is no possible assignment to i0, i1 that will satisfy z &(i0+i1). This also obviously means that there is no vector of parametric functions that can satisfy the function. The param function 496 will produce a failure as follows:

param [i0, i1][p0, p1] (z AND (i0 OR i1));

→*** failure: param: no valid parametric assignment

→for some free assignments

Figure 5:
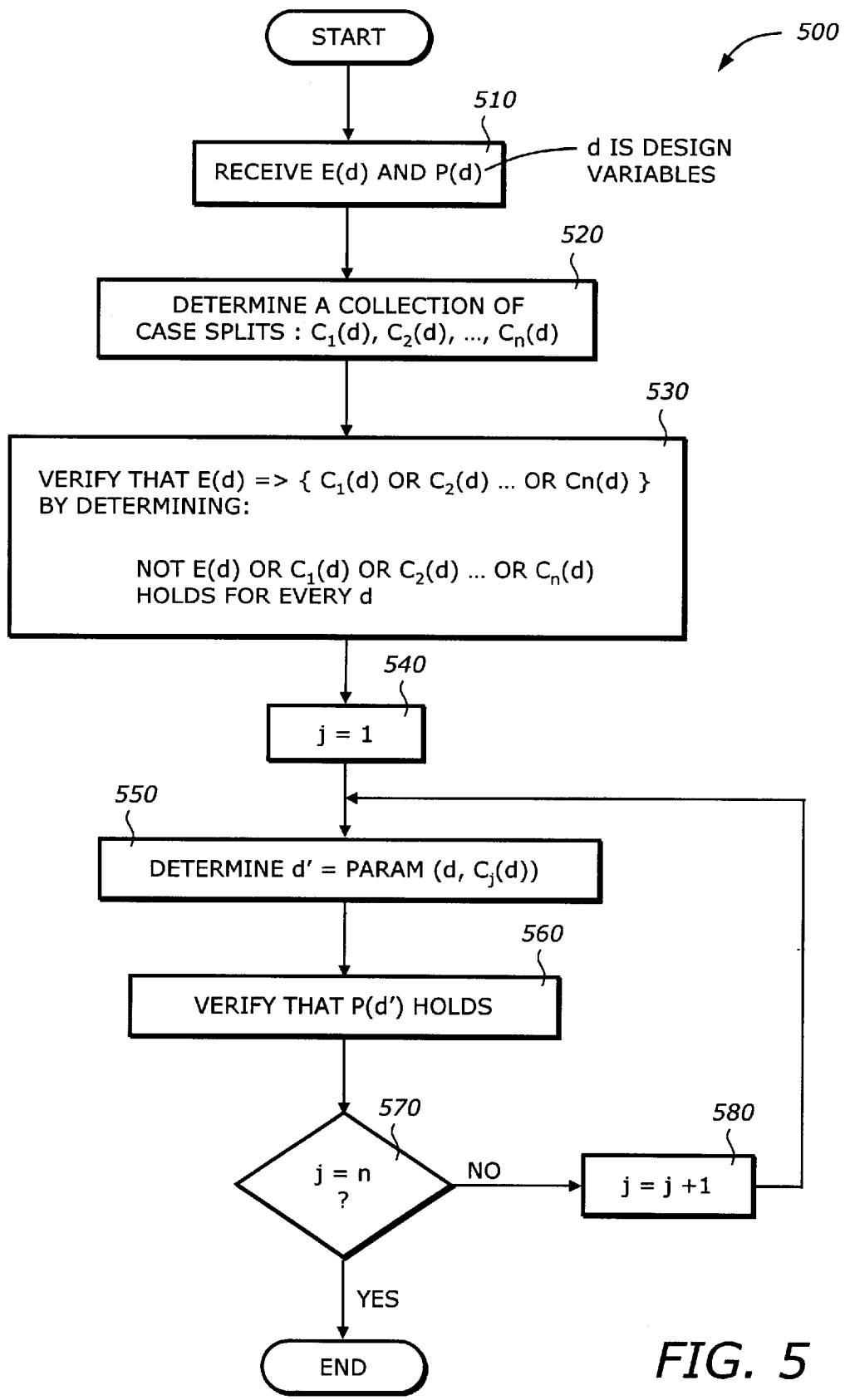
FIG. 5 is a flowchart illustrating a process to verify a design using the parametric form according to one embodiment of the invention.

FIG. 5 is a flowchart illustrating a process 500 to verify a design using the parametric form according to one embodiment of the invention.

The enhanced (or generalized) param function can be described in the following pseudo code:

```
1: gen_param(bdd var_vec[ ], bdd pvar_vec[ ], int index, bdd cond)
2: {
3:      bdd hit, low, high;
4:      bdd ires[index-1], hres[index-1], res[index];
5:
6:      if (cond = F)
```

-continued

```
7:         fatal error ("predicate not satisfiable");
8:         if (exists in_cache(var_vec, pvar_vec, index, cond))
9:             return (cached_result(var_vec, pvar_vec, index, cond));
10:        if (index = 0)
11:            return T;
12:        low  := negative_cofactor(cond, var_vec[index]);
13:        high := positive_cofactor(cond, var_vec[index]);
14:        lq   := quant_thereis(var_vec, low);
15:        hq   := quant_thereis(var_vec, high);
16:        if (low = F) {
17:            bit := hq;
18:            res := gen_param(var_vec, pvar_vec, index-1, high);
19:        } elseif (high = F) {
20:            bit := F;
21:            res := gen_param (var_vec, pvar_vec, index-1, low);
22:        } else {
23:            bit := hq AND (pvar_vec[index] OR NOT lq);
24:            lres := gen_param (var_vec, pvar_vec, index-1, low);
25:            hres := gen_param (var_vec, pvar_vec, index-1, high);
26:            for i := 1 to index-1 {
27:                res[i] := BDD_if_then_else(bit, hres[i], lres[i]);
28:            }
29:        }
30:        res[index] := bit;
31:        insert_into_cache(var_vec, pvar_vec, index, cond, res);
32:        return res;
33: }
```

The difference between the basic param function and enhanced param (gen_param) lies in how the enhanced param handles free variables. In particular, lines 14,15, 17, and 23 deal with this aspect. In lines 14 and 15 the Boolean expression (over the free variables) is computed by existentially quantifying out the variables that will be replaced by parametric variables.

Upon START, the process 500 receives the environmental predicate E(d) and the verification predicate P(d) inputs (Block 510) for all d's where d's are the design variables. From the E(d) and P(d) inputs, the process 500 determines a collection of the case splits $C_1(d)$, $C_2(d)$, . . . , $C_n(d)$ (Block 520). The process 500 then verifies that E(d) implies {$C_1(d)$ OR $C_2(d)$ . . . OR $C_n(d)$} by determining if NOT E(d) OR $C_1(d)$ OR $C_2(d)$ . . . OR $C_n(d)$ holds for every design variable d (Block 530).

The process 500 then goes through all the n decompositions by first initializing the counter j (Block 540). The process 500 then determines d' by applying the function param with the arguments d and $C_j(d)$ (Block 550). The function param is a recursive function and is described in FIG. 6. The process 500 then verifies that P(d') holds by applying the P( ) function with the argument d' (Block 460). The counter j is checked to see if all decompositions have been verified (Block 570). If not, the counter is incremented to point to the next element in the vector (Block 580). If all elements have been processed, the process 500 is terminated.

Figure 6:
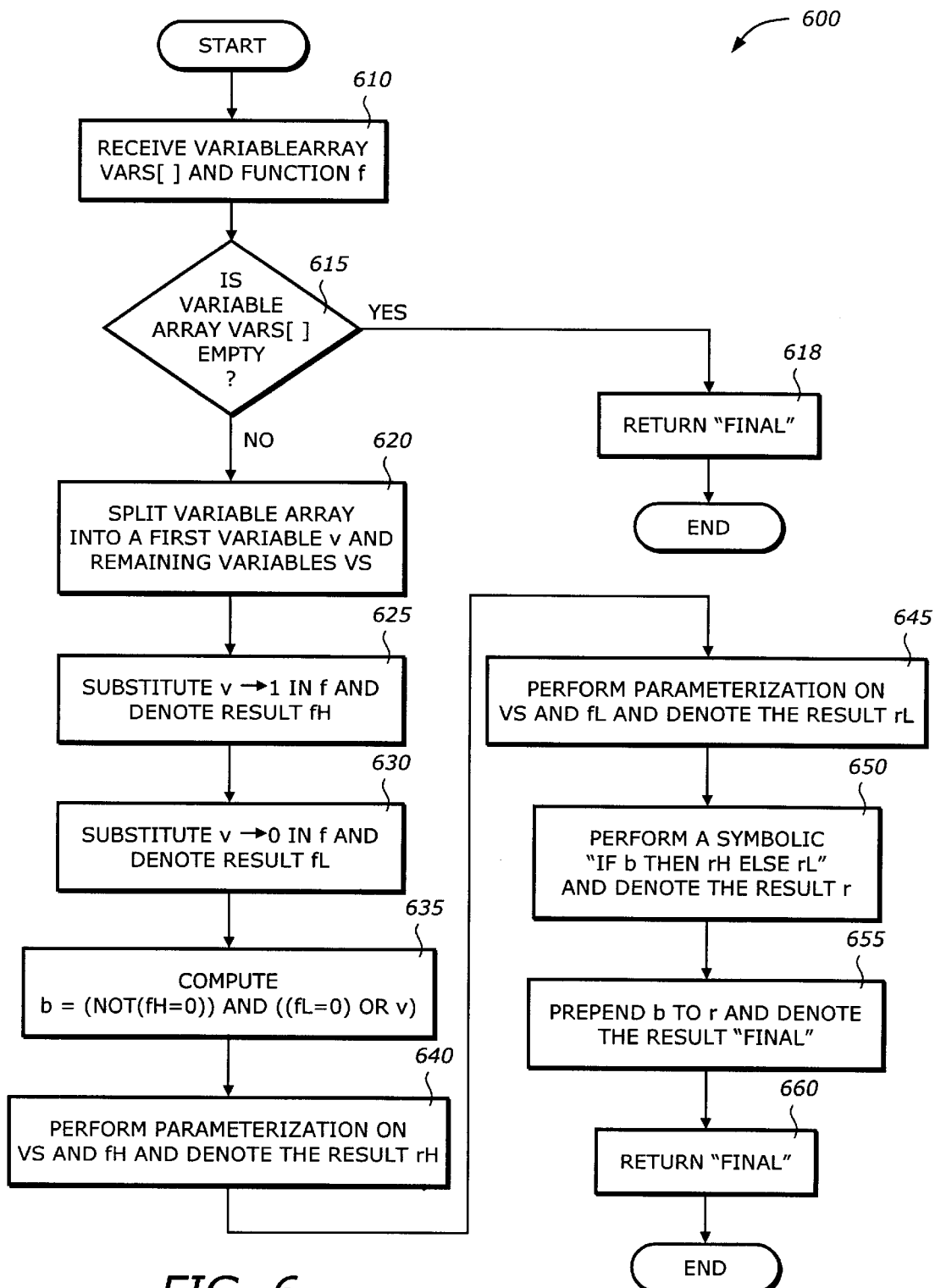
FIG. 6 is a flowchart illustrating a process to parameterize according to one embodiment of the invention.

FIG. 6 is a flowchart illustrating a process 600 to parameterize according to one embodiment of the invention. The process 600 implements the param function called in block 550 in FIG. 5.

Upon START, the process 600 receives the variable array VARS[ ] and the function f (Block 610). The process 600 determines if the variable array VARS[ ] is empty (Block 615). If it is empty, then empty list is returned (Block 618), and the process 600 is terminated. If it is not empty, the process 600 splits the variable array VARS[ ] into a first variable v and remaining variables VS (Block 620). The process 600 then substitutes v→1 in f and denote the result sub-function fH (Block 625). The process 600 next substitutes v→0 in f and denote result sub-function fL (Block 630).

Then, the process 600 computes the parameterized function b=(NOT (fH=0)) AND ((fL=0) OR v) (Block 635). The process 600 performs parameterization on VS and fH and denote the result sub-vector of parametric functions rH (Block 640). Then the process 600 performs parameterization on VS and fL and denote the result sub-vector of parametric functions rL (Block 645). Next, the process 600 performs a symbolic evaluation of the conditional expression IF b THEN rH ELSE rL and denote the result r (Block 650). The process 600 prepends b to r and denote the result final (Block 655). Then the process returns final (Block 660) and is then terminated.

The present invention is a technique to provide a significant enhancement in formal verification capacity. The technique efficiently computes a parameterization for arbitrary Boolean predicates and uses this capability to perform input-space decomposition.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. A method comprising:

splitting node variables in a vector of node variables into a first variable and a plurality of remaining variables;

determining a logic result of an expression of first and second sub-functions from a predicate based on the first variable;

generating a first parameterized function based on the logic result and at least a parametric variable;

generating first and second sub-vectors of parametric functions using the remaining variables and the first and second sub-functions, respectively;

merging the first and second sub-vectors of parametric functions by a conditional expression to generate a result vector; and prepending the first parameterized function to the result vector.

2. The method of claim 1 further comprising:

decomposing an input space into a plurality of decompositions, the input space including the node variables, the plurality of decompositions including the at least parametric variable.

3. The method of claim 1 further comprising:

verifying that the decomposing is complete;

computing one of the parametric functions for each of the plurality of decompositions; and simulating the design with one of the parametric functions.

4. The method of claim 1 wherein the parametric functions satisfy the predicate for an assignment of the at least parametric variable.

5. The method of claim 1 wherein each assignment A of the node variables satisfying the predicate corresponds to an assignment to the at least parametric variable such that the parametric functions equal A.

6. The method of claim 1 further comprising:

ordering the node variables according to a variable ordering constraint; and generating the parametric functions using the ordered node variables.

7. The method of claim 1 further comprising:
de-parameterizing the parametric functions to generate a characteristic function, the characteristic function corresponding to the predicate.

8. The method of claim 1 further comprising:
decomposing the input space into free and bound variables, the free variables not being parameterized.

9. The method of claim 8 wherein the predicate operates on the free variables and the node variables.

10. A computer program product comprising:
a computer usable medium having computer program code embodied therein to convert a predicate over a vector of node variables to a vector of functions over a plurality of at least a parametric variable, the computer program product having:
   computer readable program code to split the node variables into a first variable and a plurality of remaining variables;
   computer readable program code to receive one of the plurality of the at least parametric variable;
   computer readable program code to generate first and second sub-functions from the predicate based on the first variable;
   computer readable program code to determine a logic result of an expression of the first and second sub-functions;
   computer readable program code to generate a first parameterized function based on the logic result and the received parametric variable;
   computer readable program code to generate first and second sub-vectors of parametric functions using the remaining variables and first and second sub-functions, respectively;
   computer readable program code to merge the first and second sub-vectors of parametric functions by a conditional expression to generate a result vector; and
   computer readable program code to prepend the first parameterized function to the result vector.

11. The computer program product of claim 10 further comprising:
a computer usable medium having computer program code embodied therein for verifying a design having an input space and a predicate, the computer program product having:
   computer readable program code to decompose the input space into a plurality of decompositions, the input space including a plurality of node variables, the plurality of decompositions including the at least parametric variable.

12. The computer program product of claim 10 further comprising:
   (c) computer readable program code to verify that the decomposing is complete;
   (d) computer readable program code to compute one of the parametric functions for each of the plurality of decompositions; and
   (e) computer readable program code to simulate one of the parametric functions.

13. The computer program product of claim 10 wherein the parametric functions satisfy the predicate for any assignment of the at least parametric variable.

14. The computer program product of claim 10 wherein each assignment A of the node variables satisfying the predicate corresponds to an assignment to the at least parametric variable such that the parametric functions equal A.

15. The computer program product of claim 10 further comprising:
   computer readable program code to order the node variables according to a variable ordering constraint; and
   computer readable program code to generate the parametric functions using the ordered node variables.

16. The computer program product of claim 10 further comprising:
   computer readable program code to de-parameterize the parametric functions to generate a characteristic function, the characteristic function corresponding to the predicate.

17. The computer program product of claim 10 further comprising:
   computer readable program code to decompose the input space into free and bound variables, the free variables not being parameterized.

18. The computer program product of claim 17 wherein the predicate operates on the free variables and the node variables.

19. A system comprising:
a host processor; and
a memory coupled to the host processor, the memory including program code to verify a design having an input space and a predicate, the program code, when executed by the host processor, causing the host processor to:
   split node variables in a vector of node variables into a first variable and a plurality of remaining variables,
   determine a logic result of an expression of first and second sub-functions from the predicate based on the first variable,
   generate a first parameterized function based on the logic result and at least a parametric variable,
   generate first and second sub-vectors of parametric functions using the remaining variables and the first and second sub-functions, respectively,
   merge the first and second sub-vectors of parametric functions by a conditional expression to generate a result vector, and
   prepend the first parameterized function to the result vector.

20. The system of claim 19 wherein the parametric functions satisfy the predicate for any assignment of the at least parametric variable.

21. The system of claim 19 wherein each assignment A of the node variables satisfying the predicate corresponds to an assignment to the at least parametric variable such that the paramatic functions equal A.

22. The system of claim 19 wherein the program code further causes the host processor to:
   decompose the input space into a plurality of decompositions, the input space including a plurality of node variables, the plurality of decompositions including the at least parametric variable.

23. The system of claim 22 wherein the program code further causes the host processor to:
   verify that the decompositions are complete;
   compute one of the parametric functions for each of the plurality of decompositions; and
   simulate the design with one of the parametric functions.

* * * * *

UNITED STATES PATENT AND TRADEMARK OFFICE
CERTIFICATE OF CORRECTION

PATENT NO.   : 6,539,345 B1
DATED        : March 25, 2003
INVENTOR(S)  : Jones et al.

It is certified that error appears in the above-identified patent and that said Letters Patent is hereby corrected as shown below:

Column 6,
Line 17, delete "elself", insert -- elseif --.

Column 8,
Line 10, after "illustrating", insert -- an extension parameterizer 340 --.
Line 64, delete "ires", insert -- lres --.

Signed and Sealed this

Twelfth Day of August, 2003

JAMES E. ROGAN
*Director of the United States Patent and Trademark Office*